US006937318B2

(12) United States Patent
Van De Nieuwelaar

(10) Patent No.: US 6,937,318 B2
(45) Date of Patent: Aug. 30, 2005

(54) LITHOGRAPHIC APPARATUS, COMPUTER PROGRAM, DEVICE MANUFACTURING METHOD, AND DEVICE MANUFACTURED THEREBY

(75) Inventor: Norbertus Josephus Martinus Van De Nieuwelaar, Tilburg (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/665,351

(22) Filed: Sep. 22, 2003

(65) Prior Publication Data

US 2004/0119958 A1 Jun. 24, 2004

(30) Foreign Application Priority Data

Sep. 24, 2002 (EP) ........................................... 02256615

(51) Int. Cl.[7] ........................ G03B 27/42; G03B 27/58; G03B 27/32

(52) U.S. Cl. .............................. 355/53; 355/72; 355/77

(58) Field of Search ............................ 355/53, 75, 72, 355/77; 356/400, 401; 250/492.2

(56) References Cited

U.S. PATENT DOCUMENTS 5,715,064 A 2/1998 Lin
6,426,790 B1 * 7/2002 Hayashi ........................ 355/72
6,509,957 B1 * 1/2003 Tanaka ........................ 355/72
2001/0004105 A1 6/2001 Kwan et al.

FOREIGN PATENT DOCUMENTS

EP 1 041 357 A1 10/2000

* cited by examiner

*Primary Examiner*—Alan Mathews
(74) *Attorney, Agent, or Firm*—Pillsbury Winthrop Shaw Pittman LLP

(57) ABSTRACT

A lithographic projection apparatus including an interferometer system having a reach extending over a first, measurement station and a second, exposure station. The apparatus stores the position of the mask relative to the mask table initially. A wafer table may be transferred from the first, measurement station to the second, exposure station while fully under the control of the interferometer system. The critical path through the exposure station may then be reduced. The apparatus stores the position of the wafer relative to the wafer table at the measurement station. Subsequent alignment in the exposure station may then be performed in a shorter time as the position of the mask relative to a mask table is known.

16 Claims, 1 Drawing Sheet

LITHOGRAPHIC APPARATUS, COMPUTER PROGRAM, DEVICE MANUFACTURING METHOD, AND DEVICE MANUFACTURED THEREBY

RELATED APPLICATION

This application claims the benefit of priority to European Patent Application No. 02256615.2, filed Sep. 24, 2002, the contents of which are herein incorporated by reference.

BACKGROUND OF THE INVENTION

1. Field of the Invention

The present invention relates to a lithographic projection apparatus, a computer program, a device manufacturing method, and a device manufactured thereby.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and WO 98/38597 and WO 98/33096. In the case of a programmable mirror array, the support structure may be embodied as a frame or table, for example, which may be fixed or movable as required.

Another example of a patterning device is a programmable LCD array. An example of such a construction is given in U.S. Pat. No. 5,229,872. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. Nos. 5,969,441 and 6,262,796.

In a present dual-stage apparatus there are two stations. A substrate to be processed is first loaded onto a substrate table. This table is then moved into the first station. In the first station, measurements of the physical characteristics of the substrate are taken and stored. When the measurements are complete, the substrate table is transferred into the second station. This transferring involves releasing the substrate table from a positioning device of the first station and clamping the substrate table to a positioning device of the second station. In the second station, the substrate table is coarsely aligned, to within about 10 $\mu$m, with a mask. The mask is then finally aligned before the process of exposure can begin. When exposure is complete, the substrate table is released from a movement apparatus of the second station and the exposed substrate removed. This apparatus allows throughput of the substrate to be increased because while exposure of one substrate is occurring, the next substrate to be processed may be measured in the first station. Thus, after the first wafer has been processed, the exposure station may be re-used as soon as it has finished processing a substrate.

Another dual stage device is described in U.S. Pat. No. 5,715,064. In this device, the position of a substrate table is continuously monitored throughout its movement from a first station to a second station. The two substrate tables in the first and second stations are limited to moving in lock step. Only five relative movements of the tables are possible. This limits the throughput and also the scanning paths possible during exposure.

The limiting factor to the throughput is the critical path. A dual wafer stage wafer scanner is designed to optimally use the projection system. Therefore, the expose cycle (the exposure process) forms the critical path. The critical path includes transferring the substrate table from the measurement station into the exposure station, coarsely aligning the substrate table with the mask, finely aligning and exposing the substrate. If the exposure process itself is unchanged, then throughput of the apparatus may be improved by reducing the time spent on other processes in the critical path.

SUMMARY OF THE INVENTION

It is an aspect of the present invention to improve the throughput of a multiple stage lithographic apparatus.

This and other aspects are achieved according to the invention in lithographic apparatus including at least one substrate table configured to hold a substrate; a first station at which, at least, measurement of the substrate may be performed; a second station at which the substrate may be exposed; a displacement measuring system configured to measure displacements of the substrate table in the first and second stations; a transfer device configured to transfer the substrate table between the first and the second stations; a radiation system, associated with the second station, configured to provide a beam of radiation; a support configured to support a patterning device, the patterning device configured to pattern the beam of radiation according to a desired pattern; a projection system configured to project the patterning beam onto a target portion of the substrate, when the substrate is at the second station, wherein the displacement measuring system is configured to continuously measure displacements of the substrate table in at least two directions during transfer between the first and second stations. The transfer device may be a planar motor.

The throughput of the apparatus may therefore be increased because the position of the substrate table is known at all times during its transfer between the first and second station. When the substrate table arrives in the second station there is no need for zeroing, as the position is already known to a high degree of accuracy.

The throughput is further increased by the use of a planar motor. This allows the substrate table to be transferred directly from the measurement station into the exposure station with no delay associated with releasing the substrate table from a movement apparatus of the first station and clamping the substrate table to a movement apparatus of the second station. Thus, only a safety distance between substrate tables need be provided, and the critical path is further reduced in duration. A further benefit of using a planar motor is that it is possible to transfer the substrate table with no abrupt movements, enabling a smooth exchange between the displacement measuring devices. Additionally, there is no limitation to move the substrate table in the lockstep with another table in a different station.

Preferably, the apparatus may additionally include a first measurement system in the first station configured to measure a first relative position of the substrate to the substrate table; a second measurement system in the second station configured to measure a second relative position of the patterning device relative to its support; a storage device configured to store the first and second relative positions; and a control unit configured to calculate an exposure position based on the first and second relative positions.

By storing the two relative positions an exposure position can be calculated easily. The table can then be moved directly to the exposure position when it is transferred from the first station to the second station.

Preferably, the displacement measurement systems use interferometers. These allow accurate tracking of the relative displacement of the substrate table to within the tolerances required for lithography.

According to a second aspect of the present invention, there is provided a device manufacturing method including locating a substrate at least partially covered by a layer of radiation-sensitive material on a substrate table in a first station, the first station being a station in which, at least, measurement of the substrate may be made; transferring the substrate table to a second station, the second station being a station in which the substrate may be exposed; measuring displacements of the substrate table in the first and second stations; projecting a patterned beam of radiation onto a target portion of the layer of radiation-sensitive material while the substrate is in an exposure position in the second station; and continuously measuring displacements of the substrate table during the transferring. According to a further aspect, the method may also include measuring and storing a first relative position of the substrate to the substrate table, while the substrate table is in the first station. According to a still further aspect, for the first substrate the method may further include measuring and storing a second relative position of the patterning device relative to its support. According to yet another aspect, for each subsequent substrate the method may further include calculating an exposure position using the stored first and second relative locations; and using the exposure position as a destination during the transferring.

Thus, the above advantage of eliminating a zeroing step from the critical path may be achieved.

For the first substrate to be processed, the relative position of the patterning device relative to its support is stored. When several substrates in a batch are processed, each substrate will use the same mask. Therefore, the mask is not changed as each substrate enters and leaves the exposure station. By measuring and storing the relative position of patterning device relative to its support for the first wafer, this information can then be combined with information on the position of each subsequent substrate on the substrate table to allow the substrate table to be moved into an exposure position. Some alignment may still be required, but this would only be very small, for example to correct any errors arising due to interferometer system drift or exchange between interferometers.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. One of ordinary skill in the art will appreciate that, in the context of such alternative applications, any use of the terms “reticle”, “wafer” or “die” in this text should be considered as being replaced by the more general terms “mask”, “substrate” and “target portion”, respectively.

In the present document, the terms “radiation” and “beam” are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the present invention will now be described, by way of example only, with reference to the accompanying schematic drawings in which.

In the Figures, corresponding reference symbols indicate corresponding parts.

DETAILED DESCRIPTION

Figure 1:
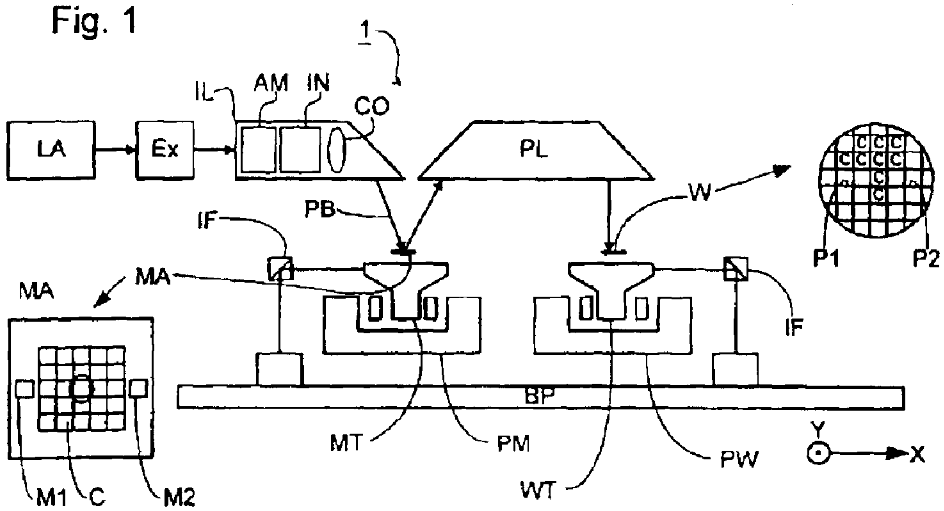
FIG. 1 depicts a lithographic projection apparatus according to an embodiment of the present invention.

FIG. 1 schematically depicts a lithographic projection apparatus 1 according to an embodiment of the invention. The apparatus 1 includes a base plate BP. The apparatus may also include a radiation source LA (e.g. UV or EUV radiation, such as, for example, generated by an excimer laser operating at a wavelength of 248 nm, 193 nm or 157 nm, or by a laser-fired plasma source operating at 13.6 nm). A first object (mask) table MT is provided with a mask holder configured to hold a mask MA (e.g. a reticle), and is connected to a first positioning device PM that accurately positions the mask with respect to a projection system or lens PL. A second object (substrate) table WT is provided with a substrate holder configured to hold a substrate W (e.g. a resist-coated silicon wafer), and is connected to a second positioning device PW that accurately positions the substrate with respect to the projection system PL. The projection system or lens PL (e.g. a mirror group) is configured to image an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example with a transmissive mask. Alternatively, the apparatus may employ another kind of patterning device, such as a programmable mirror array of a type as referred to above.

The source LA (e.g. a discharge or laser-produced plasma source) produces radiation. This radiation is fed into an illumination system (illuminator) IL, either directly or after having traversed a conditioning device, such as a beam expander Ex, for example. The illuminator IL may comprise an adjusting device AM configured to set the outer and/or inner radial extent (commonly referred to as σ-outer and σ-inner, respectively) of the intensity distribution in the beam PB. In addition, it will generally comprise various other components, such as an integrator IN and a condenser CO. In this way, the projection beam PB impinging on the mask MA has a desired uniformity and intensity distribution in its cross-section.

It should be noted with regard to FIG. 1 that the source LA may be within the housing of the lithographic projection apparatus, as is often the case when the source LA is a mercury lamp, for example, but that it may also be remote from the lithographic projection apparatus, the radiation which it produces being led into the apparatus (e.g. with the aid of suitable directing mirrors). This latter scenario is often the case when the source LA is an excimer laser. The present invention encompasses both of these scenarios.

The beam PB subsequently intercepts the mask MA, which is held on a mask table MT. Having traversed the mask MA, the beam PB passes through the lens PL, which projects the beam PB onto a target portion C of the substrate W. With the aid of the second positioning device PW and interferometer(s) IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;
2. In scan mode, essentially the same scenario applies, except that a given target portion C is not exposed in a single "flash." Instead, the mask table MT is movable in a given direction (the so-called "scan direction", e.g., the Y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼or ⅕). In this manner, a relatively large target portion C can be exposed, without having to compromise on resolution.

Figure 2:
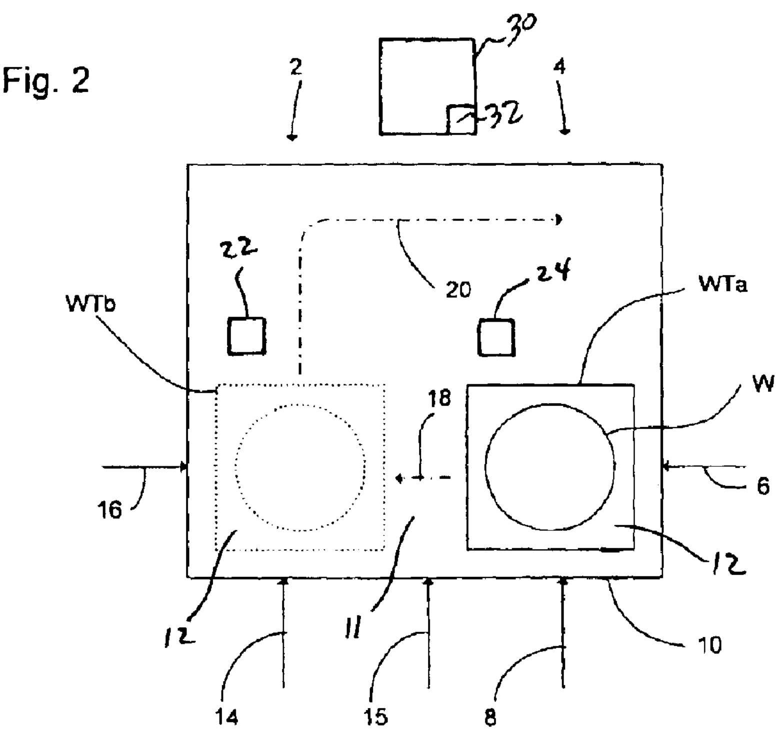
FIG. 2 illustrates movements of substrate tables between stations in the lithographic projection apparatus of FIG. 1.

FIG. 1 illustrates only the exposure station of the lithographic apparatus of the Invention. FIG. 2 shows both a first, measurement station 4 and a second, exposure station 2. In the measurement station 4, the characteristics of the substrate W and its relative position on the substrate table WTa, WTb are recorded. In the exposure station 2, the substrate W is exposed taking account of the physical characteristics of the wafer measured in the measurement station 4.

In the present embodiment, an XY table 10 extends under both the measurement station 4 and the exposure station 2. The XY table 10 is provided with a magnet array 11 (stator) of a planar motor while the coil units 12 (armature) are built into the substrate table WTa, WTb so that the substrate table WTa, WTb can be moved to any position on the XY table 10. The apparatus is also provided with an alignment system 22 configured to align the substrate table WTa, WTb with the patterning device (e.g. mask MA) in the exposure station 2. The relative displacement of the substrate table WTa, WTb is measured by an interferometer system 6, 8, 14, 15, 16. The interferometer system can measure only relative displacements, so the absolute position of substrate W and the substrate table WTa, WTb is first established by an alignment system 24 associated with the measurement station 4.

To process a substrate W, the substrate W is first clamped onto a substrate table WTa. This substrate table WTa is then moved into the measurement station 4 and its absolute position established. The substrate table, and the substrate W upon it, are then scanned in the measurement station 4 to measure the physical characteristics of the substrate W and its relative position to the substrate table WTa. These measurements are stored in a storage device (e.g., a memory) 32 of a control unit 30 for later use in the exposure station 2. The control unit 30 may be implemented on programmed general purpose computer. The control unit 30 may also be implemented on a special purpose computer, a programmed microprocessor or microcontroller and peripheral integrated circuit elements, an ASIC or other integrated circuit, a digital signal processor, a hardwired electronic or logic circuit such as a discrete element circuit, or a programmable logic device. In general, any device capable of implementing a finite state machine that is in turn capable of implementing the methods of the present invention can be used to implement the control unit 30. The control unit 30 includes a computer program that is executable to instruct the apparatus 1 to perform the methods of the present invention.

When the measuring process is complete the substrate table WTa is transferred to the exposure station 2 under the control of the planar motor. This path is illustrated by arrow 18 in FIG. 2. As the substrate table WTa moves towards the exposure station 2, it enters the measurement range of interferometer 15. For a short period the displacement of the substrate table WTa may be determined by both interferometers 8 and 15. This allows a seamless transfer of the measurement of displacement from interferometer 8 to interferometer 15. Further in the course of the movement of the substrate table WTa it enters the range of measurement of interferometer 14. Thus, its displacement is transferred seamlessly from interferometer 15 to interferometer 14.

The apparatus has two substrate tables WTa, WTb so that one can be used for an exposure while measurements are performed on the substrate held by the other. It is required that at no point in the process do the substrate tables collide. This will cause significant damage to the apparatus. To avoid collisions, the substrate tables WTa, WTb follow a clockwise path 20 around the XY table 10. Thus, as the substrate table WTa moves into the exposure station 2 there will be a point when the previous substrate table WTb has left the measurement range of the interferometer 16. At this point the displacement of substrate table WTa is measured by both interferometers 6 and 16. Thus, a seamless exchange between these two interferometers may be achieved.

It will be appreciated that when substrate table WTb leaves the XY table 10 along path 20 it will no longer be possible to measure its displacements with the interferometer system. However, this is not a problem as sufficient accuracy may be achieved using, for example, dead reckoning.

When the substrate table WTa arrives in the exposure station 2, its accurate position is known because its displacement has been continuously tracked by the interferometers 6, 8, 14, 15 and 16 as described above. Thus, there is no need for an initial zeroing step.

Furthermore, in this embodiment a further reduction in the duration of the critical path is achieved by recording the alignment of the patterning device relative to its support. All substrates in a batch will use the same mask, which will remain in the mask table MT throughout. Therefore, its position need only be measured for the first substrate in a batch. For all subsequent substrates, because the mask has not been changed, these measurements will still be valid. The data may be combined with the position of the substrate W on the substrate table WTa, WTb, which has been measured in the measurement station 4, to calculate the required destination of the substrate table WT so that it is positioned ready for exposure. Some alignment will still be required, however, for example because of inaccuracies due to interferometer system drift. There may also be small errors during exchange between interferometers. However, these errors will only be very small and thus the time for alignment of the mask is significantly reduced resulting in a corresponding reduction in the duration of the critical path.

After the substrate has been processed by the exposure station 2, it leaves the apparatus via the clockwise path 20 as described above.

It will be appreciated that the design of the interferometer system in this embodiment allows the displacement of the substrate tables WTa, WTb to be continuously tracked when it is transferred into the exposure station from the measurement station. Furthermore, the interferometer system is also capable of tracking the displacements of two substrate tables when one is located in the measurement station and another in the exposure station. The displacement of the table in the measurement station is measured by interferometers 6 and 8. The displacement of table in the exposure station 2 is measured by interferometers 14 and 16. Thus, accurate measurements of the displacement of the substrate table WT is achieved at all points during its processing where high accuracy is required, and furthermore the full benefits of parallel processing of the dual-stage device are realized.

The above described embodiment therefore allows the time a substrate spends in the exposure station, which forms the critical path through the apparatus, to be significantly reduced. Previously, the time to exchange a chuck when transferring the substrate from the measurement stage to the exposure stage would be approximately 4.7 seconds. Coarsely aligning the substrate table in the exposure station would then take a further 0.3 seconds, followed by 2 seconds for fine alignment of the mask with the exposure position. Finally there is a 29 second exposure cycle. Therefore, the exposure time accounts for approximately 80% of the critical path through the prior art apparatus.

The critical path takes 36 seconds which allows 100 wafers to be processed per hour when operating in a steady state.

The present embodiment allows a significant reduction in non-exposure time during the exposure cycle. The time taken for release and clamping of the table when it is transferred is eliminated by the planar motor. However, there is still a short period of time associated with moving the table from the measurement station 4 into the exposure station 2, and allowing a suitable safety distance from the table ahead of it. A typical value would be approximately 0.7 seconds. It has been noted above that storing the position of both the substrate W relative to the substrate table and the mask relative to the mask table allows the zeroing to be eliminated when the substrate table is transferred to the exposure station under continuous interferometer control. Furthermore, the accuracy of the movement is such that the fine mask alignment need only take approximately 0.9 seconds. This is because the errors to be corrected are relatively small. The exposure time is unchanged at 29 seconds. Therefore the exposure time now accounts for approximately 95% of the critical path through the exposure stage. Total time for the critical path is 30.6 seconds which allows 118 wafers per hour to be processed in the steady state.

Examining the time of the critical path alone shows the benefits gained to the throughput in the present invention. However, it is instructive to consider the acceptance test performance (ATP) methodology to examine the performance of the apparatus. The ATP methodology considers the throughput when only one mask is needed for a wafer. A 15 wafer lot is processed and the average time for the $3^{rd}$ to the $12^{th}$ wafers is calculated to ensure that the steady state situation is measured. Therefore, the critical path is the same as calculated above, giving a throughput increase of 18 wafers per hour or 18%.

While specific embodiments of the invention have been described above, it will be appreciated that the invention may be practiced otherwise than as described. The description is not intended to limit the invention.

What is claimed is:

1. A lithographic projection apparatus, comprising:

a substrate table configured to hold a first substrate;

a second substrate table configured to hold a second substrate;

a first station at which measurement of the first and second substrates may be performed;

a second station at which the first and second substrates may be exposed;

a displacement measuring system configured to measure displacements of the first and second substrate tables in the first and second stations;

a planar motor configured to independently transfer the first and second substrate tables between the first and the second station;

a radiation system, associated with the second station, configured to provide a beam of radiation;

a support configured to support a patterning device, the patterning device configured to pattern the beam according to a desired pattern; and a projection system configured to project the patterning beam onto a target portion of the first and second substrates when the first and second substrates are at the second station, respectively, wherein the displacement measuring system is configured to continuously measure displacements of the first and second substrate tables in at least two directions during transfer between the first and second stations.

2. A lithographic projection apparatus according to claim 1, further comprising:

a first measurement system in the first station configured to measure a first relative positions of the first and second substrates to the first and second substrate tables, respectively;

a second measurement system in the second station configured to measure a second relative position of the patterning device relative to its support;

a storage device configured to store the first and second relative positions; and a control unit configured to calculate an exposure position based on the first and second relative positions.

3. A lithographic projection apparatus according to claim 2, wherein at least one of the first and second measuring systems is also an alignment system configured to align the first and second substrates in the first and second stations, respectively.

4. A lithographic projection apparatus according to claim 1, wherein the displacement measurement system comprises interferometers.

5. A lithographic projection apparatus according to claim 1, wherein the displacement measurement system comprises a first interferometer associated with the first station configured to measure displacements of a substrate table in the first station in a first direction, a second interferometer associated with the second station configured to measure displacements of a substrate table in the second station in the first direction, and a third interferometer between the first and second stations and configured to measure displacements of a substrate table between the first and second station in the first direction.

6. A lithographic projection apparatus according to claim 1, wherein the transfer of the first and second substrate tables between the first and second stations comprises a curved path.

7. A device manufacturing method, comprising:

locating a first substrate at least partially covered by a layer of radiation-sensitive material on a first substrate table in a first station, the first station being a station in which measurement of the first substrate may be conducted;

locating a second substrate at least partially covered by a layer of radiation-sensitive material on a second substrate table in a second station, the second station being a station in which the second substrate may be exposed;

measuring displacements of the first and second substrate tables in the first and second stations, respectively;

providing a beam of radiation using a radiation system;

using a patterning device to endow the beam with pattern in its cross-section;

projecting the patterned beam of radiation onto a target portion of the layer of radiation-sensitive material while the second substrate is in an exposure position in the second station; and transferring the second substrate table out of the second station and independently transferring the first substrate table from the first station to the second station using a planar motor;

continuously measuring displacement of the first substrate table during transferring.

8. A device manufacturing method according to claim 7, further comprising:

measuring and storing a first relative position of the first substrate to the first substrate table, while the substrate table is in the first station.

9. A device manufacturing method according to claim 8, further comprising:

measuring and storing a second relative position of the patterning device relative to a support.

10. A device manufacturing method according to claim 8, further comprising:

calculating an exposure position using the stored first and second relative locations; and using the exposure position as a destination during the transferring.

11. A computer program comprising a program code that, when executed on a control unit configured to control a lithographic projection apparatus, instructs the lithographic projection apparatus to perform the method of claim 7.

12. A computer program comprising a program code that, when executed on a control unit configured to control a lithographic projection apparatus, instructs the lithographic projection apparatus to perform the method of claim 8.

13. A computer program comprising a program code that, when executed on a control unit configured to control a lithographic projection apparatus, instructs the lithographic projection apparatus to perform the method of claim 9.

14. A computer program comprising a program code that, when executed on a control unit configured to control a lithographic projection apparatus, instructs the lithographic projection apparatus to perform the method of claim 10.

15. A device manufacturing method according to claim 7, wherein measuring displacements of the first and second substrates tables in the first and second station is performed by first and second interferometers associated with the first and second station, respectively, and continuously measuring displacements of the first substrate table during transferring comprises measuring displacements of the first substrate table at a position intermediate the first and second station by a third interferometer intermediate the first and second station.

16. A device manufacturing method according to claim 7, wherein transferring the second substrate table out of the second station and independently transferring the first substrate table from the first station to the second station comprises transferring the first and second substrate tables in a curved path.

* * * * *